(12) United States Patent
Nakagawa et al.

(10) Patent No.: US 6,381,117 B1
(45) Date of Patent: Apr. 30, 2002

(54) CERAMIC ELECTRONIC COMPONENT

(75) Inventors: Takuji Nakagawa, Takefu; Yoshikazu Takagi, Sabae; Yasunobu Yoneda, Takefu; Toru Watanabe, Fukui, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/656,724

(22) Filed: Sep. 7, 2000

(30) Foreign Application Priority Data

Sep. 8, 1999 (JP) .......................................... 11-253870

(51) Int. Cl.⁷ .......................... H01G 4/228; H01G 4/30; H01G 4/20; H01G 4/06
(52) U.S. Cl. ................ 361/306.3; 361/301.4; 361/320; 361/321.3
(58) Field of Search ................ 361/301.1, 301.3–301.4, 361/303–305, 306.1–306.3, 307, 308.1–308.3, 309, 310–312, 320, 321.1–321.5

(56) References Cited

U.S. PATENT DOCUMENTS 5,712,758 A * 1/1998 Amano et al. ........... 361/321.2
5,805,409 A 9/1998 Takahara et al.

FOREIGN PATENT DOCUMENTS

| GB | 2327631 A | | 2/1999 | |
| JP | 2-17619 | * | 1/1990 | ............ H01G/1/14 |
| JP | 4-105310 | | 4/1992 | |
| JP | 4-188813 | | 7/1992 | |
| JP | 5-226180 | | 9/1993 | |

* cited by examiner

*Primary Examiner*—Dean A. Reichard
*Assistant Examiner*—Eric W. Thomas
(74) *Attorney, Agent, or Firm*—Ostrolenk, Faber, Gerb & Soffen, LLP

(57) ABSTRACT

A ceramic electronic component includes at least one component body having two end faces opposing each other and side faces connecting the two end faces, and terminal electrodes formed on the component body. Each of the terminal electrodes extends from each end face to edge portions of each side face of the component body. Each of the terminal electrodes includes a metal layer formed on at least each end face of the component body, a conductive resin layer for covering at least portions of the side faces of the component body, and a metal plating film covering the outer surface of the terminal electrode. The conductive resin layer extends from the metal layer including the edge of the metal layer to the portions of the side faces, and includes a conductive resin containing metal powder and resin. The thickness of the conductive resin layer above the side faces is at least about 10 µm.

17 Claims, 3 Drawing Sheets

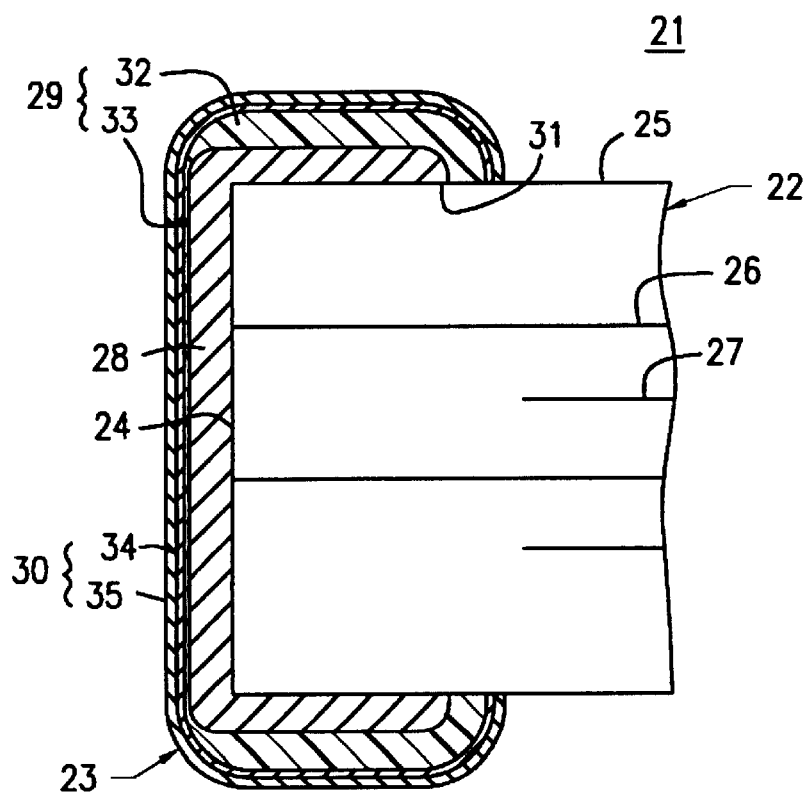
FIG. 4
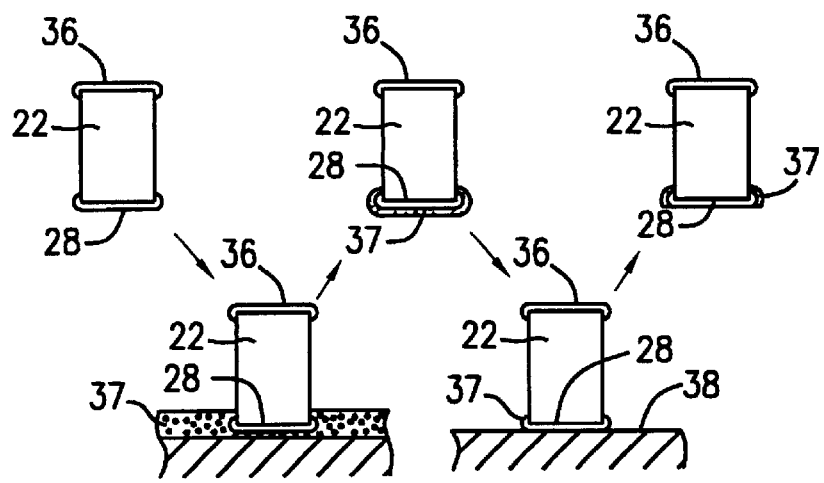
FIG. 5A  FIG. 5C  FIG. 5E
FIG. 5B  FIG. 5D

CERAMIC ELECTRONIC COMPONENT

BACKGROUND OF THE INVENTION

1. Field of the Invention

The present invention relates to ceramic electronic components. In particular, the present invention relates to the structure of a terminal portion and an improvement in material of a ceramic electronic component, such as a monolithic ceramic capacitor, which includes a ceramic electronic component body (hereinafter referred to as a component body) and is surface-mounted.

2. Description of the Related Art

FIG. 1 is a cross-sectional view of a surface-mounted ceramic electronic component 1 which is one of interest in the present invention. The ceramic electronic component 1 includes a rectangular parallelepiped component body 2 having two end faces 3 and 4 opposing each other and four side faces 5 which connect the end faces 3 and 4.

Terminal electrodes 6 and 7 are formed on the end faces 3 and 4, respectively. The terminal electrodes 6 and 7 are formed by, for example, coating and baking a conductive paste, and extend over edge portions of the side faces 5.

The component body 2 is a main constituent of a monolithic ceramic capacitor and includes a plurality of internal electrodes 8 and 9 which are alternately arranged in the interior thereof. The internal electrodes 8 are electrically connected to the terminal electrode 6, whereas the internal electrodes 9 are electrically connected to the terminal electrode 7.

A mounting board 10 for mounting the ceramic electronic component 1 has conductive lands 11 and 12 corresponding to the terminal electrodes 6 and 7, respectively. In surface mounting of the ceramic electronic component 1 onto the mounting board 10, the terminal electrodes 6 and 7 are aligned onto the conductive lands 11 and 12, respectively, and the terminal electrodes 6 and 7 are soldered to the conductive lands 11 and 12, respectively, for example, by a solder reflow process. In the drawing, reference numerals 13 and 14 represent solder provided by the solder reflow process. The solder 13 and 14 is provided on the end faces 3 and 4, respectively, including the extensions which extend over the edge portions of the side faces 5.

In the above surface mounting of the ceramic electronic component 1, distortion of the mounting board 10 and thermal shock cycles involving repeated rising and falling of temperature cause relatively large stresses in the terminal electrodes 6 and 7 and the component body 2. As a result, cracks 15 form in the component body 2, as shown in FIG. 1.

Further, as shown in FIG. 2, there is a case in which solders 13 and 14 are provided not only on the end surfaces 3 and 4 of the terminal electrodes 6 and 17, but also on a side face 5a. In such a case a crack 15 may be provided on the side face 5a side.

Since the stresses causing such cracks 15 particularly affect the component body 2 at the extensions of the terminal electrodes 6 and 7 over the side faces 5, 5a, the cracks 15 readily form in the vicinity of edges 16 and 17 of the terminal electrodes 6 and 7, respectively. Moreover, the solder 13 and 14 provided on the extensions of the terminal electrodes 6 and 7 over the side faces 5, 5a enhances the stress.

When the mounting board 10 is a metal-core mounting board, such as an aluminum board composed of an aluminum base covered with an insulating coating, a large difference in thermal expansion coefficients between the mounting board 10 and the component body 2 causes a large stress during the thermal shock cycles, and thus the cracks 15 readily form.

When the component body 2 is a high-capacitance monolithic ceramic capacitor composed of a Pb-based ceramic dielectric material, the component body 2 has a relatively low bending strength. Thus, the cracks 15 more readily form.

The cracks 15 cause a decrease in humidity resistance and a decrease in thermal shock resistance of the ceramic electronic component 1. Moreover, the cracks 15 cause decreased electrical characteristics such as insulation resistance. As a result, the ceramic electronic component 1 is less reliable.

In order solve the above problems, a conductive resin composed of a resin and metal powder is used for the formation of the terminal electrodes 6 and 7 so that the deformable conductive resin can relax the stress. However, the adhesive strength of the conductive resin of the terminal electrodes 6 and 7 to the component body 2 decreases after the ceramic electronic component 1 is placed in a high-temperature atmosphere, e.g., of approximately 150° C., for a long period or in a high-temperature, high-humidity environment, of e.g., at 85° C. and an 86% humidity. As a result, the terminal electrodes 6 and 7 are easily detached from the component body 2.

FIG. 3 is a cross-sectional view of another ceramic electronic component 1a which is one of interest in the present invention. In FIG. 3, elements corresponding to the elements shown in FIG. 1 are referred to with the same reference numerals and a repeated description is omitted. The ceramic electronic component 1a is provided in order to solve the above problems regarding the cracks 15. In the ceramic electronic component 1a, a resin coat 18 is applied over the extensions of the terminal electrodes 6 and 7 and the side faces 5. Thus, the solder 13 and 14 is provided only on the end faces 3 and 4 of the terminal electrodes 6 and 7, respectively.

When the ceramic electronic component 1a is mounted onto the mounting board 10, the solder 13 and 14 is not provided on the extensions of the terminal electrodes 6 and 7 on the side faces 5. Thus, the resin coat 18 contributes to a decreased stress and prevents the formation of the cracks 15.

The surface mounting of the ceramic electronic component 1a shown in FIG. 3, however, inhibits direct contact of the terminal electrodes 6 and 7 to the conductive lands 11 and 12, respectively, and causes a decreased contact area of the terminal electrodes 6 and 7 with the solder 13 and 14, respectively. Thus, the bonding strength, particularly the shear strength, of the ceramic electronic component 1a to the mounting board 10 is not so high. As a result, the ceramic electronic component 1a may become detached from the mounting board 10.

SUMMARY OF THE INVENTION

It is an object of the present invention to provide a ceramic electronic component which does not cause the formation of cracks and decreased shear strength.

The present invention is directed to a ceramic electronic component comprising at least one component body having two end faces opposing each other and side faces connecting the two end faces, and terminal electrodes formed on the component body, each extending from each end face to edge portions of each side face of the component body. The terminal electrode is characterized as follows in order to solve the above problems.

Each of the terminal electrodes comprises a metal layer formed on at least each end face of the component body, and a conductive resin layer for covering at least portions of the side faces of the component body, the conductive resin layer extending from the metal layer including the edge of the metal layer to the portions of the side faces, and comprising a conductive resin containing metal powder and resin. The thickness of the conductive resin layer above the side faces is at least about 10 µm. A metal plating film covers the outer surface of the terminal electrode.

The metal layer ensures sufficiently high bonding strength to the component body and the plating film facilitates soldering to the terminal electrodes of the ceramic electronic component.

The conductive resin layer relaxes the stress due to distortion of a mounting board and thermal shocks so that cracks do not form in the component body. Thus, the ceramic electronic component has highly reliable electrical characteristics.

Preferably, the thickness of the conductive resin layer above the side faces is in a range of about 20 to 70 µm.

When the thickness of the conductive resin layer above the side faces is at least about 20 µm, the stress is more effectively relaxed. On the other hand, a thickness of not more than about 70 µm does not cause a significant decrease in the shear strength and a significant increase in the ESR due to suppressed deterioration of the conductive resin layer.

Preferably, the conductive resin layer extends above each end face of the component body, and the thickness of the conductive resin layer above each end face is not more than about 5 µm.

In such a configuration, the stress is more effectively relaxed. When the thickness of the conductive resin layer above each end face is not more than about 5 µm, the shear strength does not significantly decrease and the ESR does not significantly increase.

In the present invention, the metal layer may be formed by coating and baking a conductive paste containing, for example, Ag, Ag—Pd, Ni or Cu.

This metal layer enhances the bonding strength between the metal layer and the component body, and the bonding strength is resistant to large stress due to thermal shock even when the metal layer is thick.

Preferably, the metal plating film comprises a underlying metal film preventing diffusion of solder into the conductive resin layer and a surface metal film having high solderability.

Such a double layer plating film configuration prevents deterioration of the conductive resin layer due to diffusion of the solder and ensures solderability to the terminal electrode.

In the present invention, the component body may be a plurality of ceramic bodies and the ceramic bodies are stacked so that the terminal electrodes are aligned in the same directions.

In the present invention, it is preferable that the component body is a constituent of a monolithic ceramic capacitor.

BRIEF DESCRIPTION OF THE DRAWINGS

FIG. 4 is a partial cross-sectional view of a ceramic electronic component in accordance with a first embodiment of the present invention;

FIGS. 5A to 5E are schematic cross-sectional views showing a method for making a conductive resin layer of the ceramic electronic component shown in FIG. 1;

DESCRIPTION OF THE PREFERRED EMBODIMENTS

Figure 1:
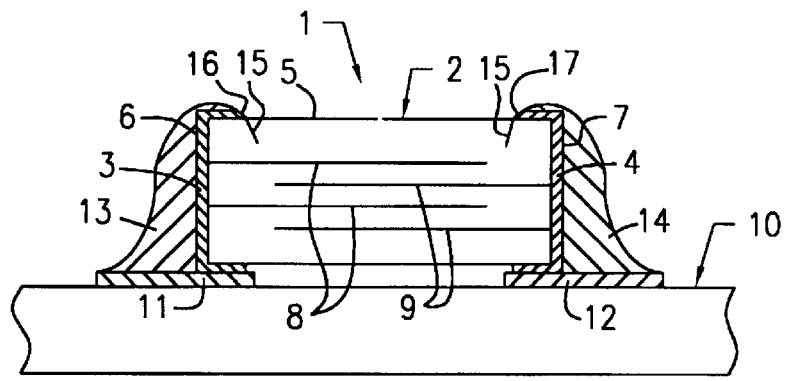
FIG. 1 is a cross-sectional view of a conventional surface-mounted ceramic electronic component.
Figure 2:
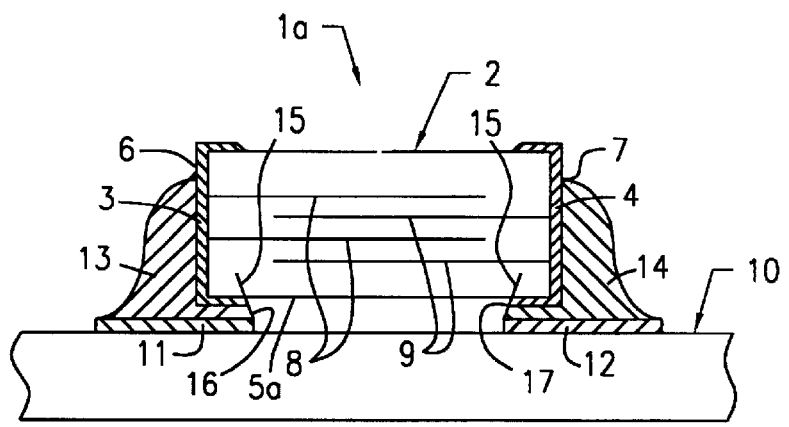
FIG. 2 is a cross-sectional view of another conventional ceramic electronic component.
Figure 3:
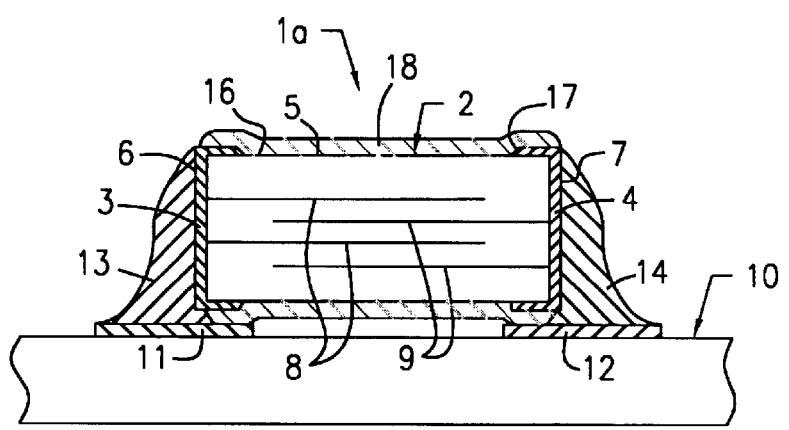
FIG. 3 is a cross-sectional view of still another conventional ceramic electronic component.

FIG. 4 is a partial cross-sectional view of a ceramic electronic component 21 in accordance with a first embodiment of the present invention. In FIG. 3, only one end of a component body 22 of the ceramic electronic component 21 and one terminal electrode 23 are depicted. Since the other end and another terminal electrode of the component body 22 have substantially the same configurations as this end and the terminal electrode 23, the description is based on one end and the terminal electrode 23.

The component body 22 is a rectangular parallelepiped, has two end faces opposing each other of which one end face 24 is depicted in the drawing, and has four side faces 25 connecting these two end faces. The terminal electrode 23 is formed on the end face 24.

When the component body 22 constitutes a monolithic ceramic capacitor, a plurality of internal electrodes 26 and 27 are alternately formed and face each other therein. The internal electrodes 26 are electrically connected to the terminal electrode 23, whereas the internal electrodes 27 are electrically connected to the other terminal electrode not shown in the drawing.

The terminal electrode 23 is composed of an underlying metal layer 28, a conductive resin layer 29 formed on the underlying metal layer 28, and a plating film 30 formed on the conductive resin layer 29. The underlying metal layer 28 is formed by, for example, coating and baking a conductive paste containing Ag, Ag—Pd, Ni or Cu. Alternatively, the underlying metal layer 28 may be formed by an electroless plating process, a vacuum deposition process or a spray coating process.

The underlying metal layer 28 is formed at least on the end face 24 of the component body 22. In this embodiment, the underlying metal layer 28 extends over the end face 24 and end portions of the side faces 25 of the component body 22.

The conductive resin layer 29 is composed of a conductive resin containing metal powder and resin. A typical example of the metal powder is aluminum powder. Examples of resins include thermosetting resins, such as an epoxy resin, polyimide resin, silicone resin, high-melting-point thermoplastic resins, such as a polyester resin and a polyether sulfone resin, and mixtures thereof.

The conductive resin layer 29 covers the underlying metal layer 28 and at least the end portions of the side faces 25 of the component body 22 in the vicinity of edges 31 of the underlying metal layer 28. In this embodiment, the conductive resin layer 29 has side face portions 32 formed above the side faces 25 and an end face portion 33 formed above the end face 24.

The mixture of the high melting point thermoplastic resin and the thermosetting is effective against the generation of cracks in high temperature because the mixture combines the good characteristics of both.

The present invention is characterized by the thickness of the conductive resin layer 29. The thickness of the conductive resin layer 29 is at least about 10 µm at the side face portions 32, and is more preferably in a range of about 20 to 70 µm. When the conductive resin layer 29 has the end face portion 33, the thickness of the end face portion 33 is not more than about 5 µm.

The plating film 30 is formed by plating a desired metal. It is preferable that the plating film 30 exhibit superior solderability and prevent diffusion of solder into the conductive resin layer 29 when the terminal electrode 23 is bonded to a conductive land on a mounting board (not shown in the drawing) with the solder. Such a plating film 30 can prevent deterioration of the conductive resin layer 29.

Thus, the plating film 30 in this embodiment preferably includes at least two layers, that is, an underlying metal film 34 for preventing diffusion of the solder into the conductive resin layer 29 and a surface metal film 35 having superior solderability. The underlying metal film 34 is preferably composed of, for example, Ni, and the surface metal film 35 is preferably composed of, for example, Cu, Sn, Pb—Sn, Ag or Pd.

When the ceramic electronic component 21 is mounted onto the mounting board, solder for bonding a conductive land on the mounting board to the terminal electrode 23 spreads on the terminal electrode 23 over the end face 24 and the end portions of the side faces 25. Such a sufficiently large soldered area enhances bonding strength, particularly shear strength, of the mounted ceramic electronic component 21.

The conductive resin layer 29 effectively relaxes stress which is generated in the terminal electrode 23 and the component body 22 by the distortion and heat shock cycles of the mounting board, and prevents the formation of cracks in the component body 22. Although cracks are easily formed in the component body 22 in the vicinity of the edges 31 of the underlying metal layer 28, the conductive resin layer 29 formed over the underlying metal layer 28 and the end portions of the side faces 25 including the edges 31 of the underlying metal layer 28 mechanically reinforces these weak portions. In this embodiment, the end face portion 33 of the conductive resin layer 29 can relax stress.

FIGS. 5A to 5E show a method for forming the conductive resin layer 29.

With reference to FIG. 5A, the component body 22 having the metal layer 28 and a metal layer 36 at both ends is prepared.

With reference to FIG. 5B, the end at the side of the underlying metal layer 28 is dipped into an uncured conductive resin 37. With reference to FIG. 5C, the component body 22 is removed from the uncured conductive resin 37. The underlying metal layer 28 is covered by the uncured conductive resin 37.

With reference to FIG. 5D, the underlying metal layer 28 is jammed onto a scraping plate 38. With reference to FIG. 5E, the component body 22 is removed from the scraping plate 38. The uncured conductive resin 37 remains on side faces of the component body 22, whereas the major fraction of the uncured conductive resin 37 on the end face is transferred onto the scraping plate 38 and a small fraction remains on the end face. Thus, the uncured conductive resin 37 on the end face portion 33 has a thickness of not more than about 5 µm.

The same steps are performed for the other end at the side of the metal layer 36 of the component body 22. The conductive resin 37 is cured by heat to form the conductive resin layer 29 shown in FIG. 3.

Figure 6:
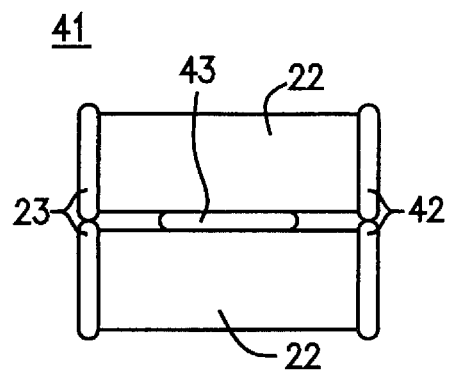
FIG. 6 is a front view of a ceramic electronic component in accordance with a second embodiment of the present invention.

FIG. 6 is a front view of a ceramic electronic component 41 in accordance with a second embodiment of the present invention. In FIG. 5, elements corresponding to the elements in FIG. 3 are referred to with the same reference numerals and a repeated description is omitted.

The ceramic electronic component 41 includes a plurality of ceramic bodies 22. These two ceramic bodies 22 are stacked so that each terminal electrode 23 and each terminal electrode 42 are aligned in the same direction. These ceramic bodies 22 may be bonded to each other using an adhesive 43, if necessary. The terminal electrodes 23 and 42 have substantially the same configuration as that of the terminal electrode 23 shown in FIG. 4.

The ceramic electronic component 41 shown in FIG. 6 may be formed by stacking a plurality of ceramic bodies 22, each having terminal electrodes 23 and 42, or may be formed by stacking a plurality of ceramic bodies 22, each having only a metal layer 28, and then forming conductive resin layers 29 and plating films 30, as shown in FIG. 4.

According to the ceramic electronic component 41 including the plurality of ceramic bodies 22, when each of the ceramic bodies 22 is a monolithic ceramic capacitor, the monolithic ceramic capacitor has further increased electrostatic capacitance.

Figure 7:
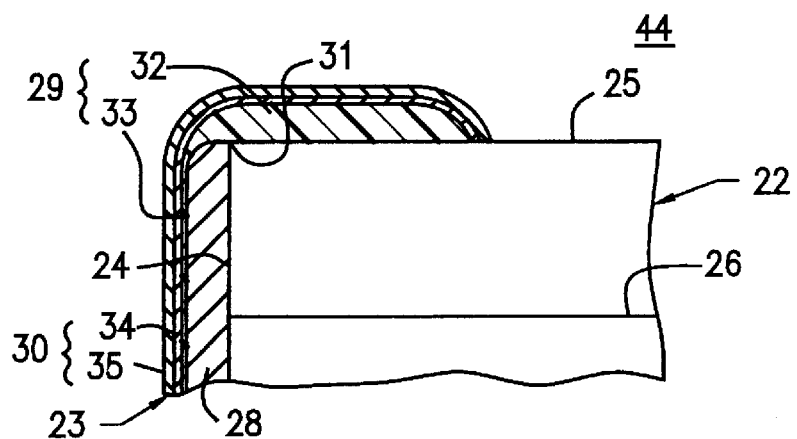
FIG. 7 is a partial cross-sectional view of a ceramic electronic component according to a third embodiment of the present invention.

FIG. 7 is a partial cross-sectional view of a ceramic electronic component 44 according to a third embodiment of the present invention. In FIG. 7, elements corresponding to the elements in FIG. 4 are referred to with the same reference numerals and a repeated description is omitted.

In the ceramic electronic component 44 shown in FIG. 7, the metal layer 28 is formed only on the end face 24 of the component body 22. The conductive resin layer 29 includes the end face portion 33 formed on the underlying metal layer 28 and the side face portions 32 formed over the edge 31 of the underlying metal layer 28 and end portions of the side faces 25 of the component body 22, and the thickness of the side face portions 32 is at least about 10 µm. The thickness of the end face portion 33 is not more than about 5 µm.

A plating film 30 composed of an underlying film 34 and a surface layer 35 is formed on the conductive resin layer 29.

Figure 8:
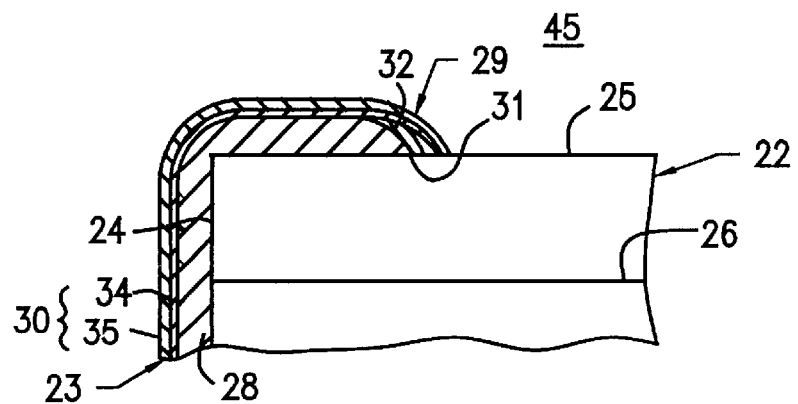
FIG. 8 is a partial cross-sectional view of a ceramic electronic component according to a fourth embodiment of the present invention.

FIG. 8 is a partial cross-sectional view of a ceramic electronic component 45 according to a fourth embodiment of the present invention. In FIG. 8, elements corresponding to the elements in FIG. 4 are referred to with the same reference numerals and a repeated description is omitted.

In the ceramic electronic component 45 shown in FIG. 8, the conductive resin layer 29 has only a side face portion 32 and does not have an end face portion. The conductive resin layer 29 is formed over the underlying metal layer 28, the edge of the underlying metal layer 28, and a part of the side face 25 of the component body 22, and the thickness of the conductive resin layer 29 is at least about 10 µm.

The plating film 30 includes a portion formed on the metal layer 28 and a portion formed on the conductive resin layer 29 and includes an underlying film 34 and a surface film 35.

The underlying film 34 prevents diffusion of solder applied to the terminal electrode 23 into the conductive resin layer 29, as described above. When the conductive resin layer 29 is not formed over the entire terminal electrode 23, as shown in FIG. 8, diffusion of solder is not so significant. Thus, the underlying film 34 may be omitted in such a configuration.

Examples for illustrating the advantages of the present invention will now be described. In the examples, the structure of the ceramic electronic component 21 shown in FIG. 4 was employed, and thicknesses of the side face portions 32 and the end face portion 33 of the conductive resin layer 29 were varied.

Ceramic bodies 22 were prepared. Each component body 22 functioned as a monolithic ceramic capacitor having an electrostatic capacitance of 1 μF and was composed of a barium titanate-based dielectric ceramic material having a planar size of 5.7 mm×5.0 mm. A Cu paste with a thickness of 100 μm was applied onto each end of the component body 22, was dried at a temperature of 150° C. for 10 minutes and was baked at a temperature of 800° C. for 5 minutes to form a metal layer 28.

As shown in Table 1, a conductive resin layer 29 was formed on the metal layer 28 of each component body 22. Samples provided with conductive resin layers 29 having different thicknesses at side face portion 32 and end face portion 33 were thereby provided. In Table 1, "side face thickness" represents the thickness of the side face portion 32 and "end face thickness" represents the thickness of the end face portion 33.

The conductive resin layer 29 was formed by applying a conductive resin 37 containing Ag powder and an epoxy resin and by curing the conductive resin 37 at a temperature of 260° C. for 30 minutes. The side face thickness and the end face thickness were varied by adjusting the viscosity of the conductive resin 37 before coating or the scraping conditions of the scraping plate 38 shown in FIG. 5D.

An underlying film 34 composed of nickel having a thickness of 1 μm was formed on the metal layer 28 for Sample 1, or on the conductive resin layer 29 for each of Samples 2 to 10, by a wet plating process, and a surface layer 35 composed of tin having a thickness of 5 μm was formed thereon to form a plating film 30. Ceramic electronic components of Samples 1 to 10 were thereby completed.

Each ceramic electronic component, that is, a monolithic ceramic capacitor, was mounted onto an aluminum board. The shear strength, the equivalent series resistance (ESR), the failure rate during thermal shock cycling, and the failure rate during humid loading were evaluated, as shown in Table 1.

The shear strength was measured after the sample was allowed to stand at a temperature of 150° C. for 500 hours.

The ESR was measured by applying an alternating current of 1 MHZ to the sample which was allowed to stand at a temperature of 150° C. for 500 hours.

In the measurement of the failure rate during thermal shock cycling, after thermal shock—500 cycles of changes in temperature between −55° C. and +125° C.—was applied to the sample, the insulating resistance and the electrostatic capacitance were measured. Failure was defined as a sample having insulation resistance outside of a predetermined range or change in capacitance of at least 20%. In Table 1, the number of failed samples among 18 tested samples is shown.

In the measurement of the failure rate during humid loading, the samples after the above thermal shock cycles were subjected to a humid loading test at a temperature of 85° C. and a relative humidity of 85% for 500 hours. Failure rate was defined as a sample having insulation resistance outside of a predetermined range. In Table 1, the number of failed samples among 18 tested samples which passed the thermal shock cycling test is shown.

TABLE 1

| Sample | Side face thickness (μm) | End face thickness (μm) | Shear strength (kgf) | ESR (mΩ) | Failure rate during thermal shock cycling | Failure rate during humid loading |
|---|---|---|---|---|---|---|
| 1 | 0 | 0 | 15 | 10 | 10/18 | 5/18 |
| 2 | 5 | 5 | 15 | 10 | 10/18 | 5/18 |
| 3 | 8 | 5 | 15 | 11 | 6/18 | 3/18 |
| 4 | 10 | 5 | 15 | 12 | 1/18 | 0/18 |
| 5 | 20 | 5 | 15 | 12 | 0/18 | 0/18 |
| 6 | 30 | 5 | 15 | 13 | 0/18 | 0/18 |
| 7 | 30 | 2 | 13 | 16 | 0/18 | 0/18 |
| 8 | 70 | 5 | 15 | 15 | 0/18 | 0/18 |
| 9 | 70 | 70 | 10 | 19 | 0/18 | 0/18 |
| 10 | 150 | 5 | 12 | 17 | 2/18 | 0/18 |

Table 1, the ceramic electronic components of Sample Nos. 4 to 10 are based on the present invention. Among them, the ceramic electronic components of Sample Nos. 5, 6 and 8 are more preferred in the present invention. The ceramic electronic components of Sample Nos. 1 to 3 are outside of the present invention.

Sample Nos. 4 to 10 exhibit satisfactory results regarding the failure rate during thermal shock cycling and the failure rate during humid loading, compared to the results of Samples Nos. 1 to 3. Thus, in Sample Nos. 4 to 10, the formation of cracks is suppressed in the ceramic bodies 22.

In Sample Nos. 5, 6 and 8, each having a side face thickness of about 20 to 70 μm and an end face thickness of not more than about 5 μm, no defects occur during the thermal shock cycles and during the humid loading test. In these samples, the shear strength does not decrease and the ESR does not substantially increase compared to Sample Nos. 1 to 3.

In Sample Nos. 10 in accordance with the present invention, two ceramic electronic components are damaged during the thermal shock cycles. This failure is due to the formation of cracks in the conductive resin layer during the thermal shock cycles. The results show that a side face thickness exceeding about 70 μm causes the formation of cracks due to deterioration of the resin.

In Sample Nos. 1 to 3 which are outside of the present invention, many samples are damaged during the thermal shock cycles and the humid loading test, although the shear strength and the ESR are satisfactory. Thus, in Sample Nos. 1 to 3, cracks form in the ceramic bodies 22.

What is claimed is:

1. A ceramic electronic component comprising:
   a component body having two end faces opposing each other and side faces connecting the two end faces; and
   terminal electrodes on the component body on each end face, each extending to edge portions of each side face of the component body,
   each terminal electrode comprising:
      a first metal layer on an end face of the component body;
      a conductive resin layer covering the end faces and at least a portion of the side faces of the component body, the conductive resin layer extending to cover the edge of the metal layer at the side faces, and comprising a conductive resin comprising metal powder and resin, the thickness of the conductive resin layer above the side faces being at least about 10 $\mu$m and the thickness of the conductive resin layer above the end faces being not more than about 5 $\mu$m; and a second metal layer comprising the outermost surface of the terminal electrode.

2. A ceramic electronic component according to claim 1, wherein the thickness of the conductive resin layer above the side faces is in a range of about 20 to 70 $\mu$m.

3. A ceramic electronic component according to claim 2, wherein the first metal layer comprises a baked conductive paste.

4. A ceramic electronic component according to claim 3, wherein the second metal layer comprises an underlying metal film adapted to prevent diffusion of solder into the conductive resin layer and an overlying surface metal film having high solderability.

5. A ceramic electronic component comprising a plurality of component bodies according to claim 4 stacked so that the terminal electrodes are aligned in the same direction.

6. A ceramic electronic component according to claim 5, wherein each component body is a monolithic ceramic capacitor.

7. A ceramic electronic component according to claim 1, wherein the first metal layer comprises a baked conductive paste.

8. A ceramic electronic component according to claim 1, wherein the second metal layer comprises a underlying metal film adapted to prevent diffusion of solder into the conductive resin layer and an overlying surface metal film having high solderability.

9. A ceramic electronic component comprising a plurality of component bodies according to claim 8 stacked so that the terminal electrodes are aligned in the same direction.

10. A ceramic electronic component according to claim 1, wherein the second metal layer comprises an underlying metal film adapted to prevent diffusion of solder into the conductive resin layer and an overlying surface metal film having high solderability.

11. A ceramic electronic component comprising a plurality of component bodies according to claim 10 stacked so that the terminal electrodes are aligned in the same direction.

12. A ceramic electronic component according to claim 11, wherein each component body is a monolithic ceramic capacitor.

13. A ceramic electronic component comprising a plurality of component bodies according to claim 1 stacked so that the terminal electrodes are aligned in the same direction.

14. A ceramic electronic component according to claim 13, wherein each component body is a monolithic ceramic capacitor.

15. A ceramic electronic component according to claim 13, wherein the component body has a plurality of electrodes in its interior, some of which are in electrical contact with one terminal electrode and the others of which are in electrical contact with the other terminal electrode.

16. A ceramic electronic component according to claim 15, wherein the second metal layer comprises a film adapted to prevent diffusion of solder into the conductive resin layer on the conductive resin layer and an overlying surface metal film having high solderability.

17. A ceramic electronic component according to claim 16, wherein the thickness of the conductive resin layer covering adjacent portion of the side faces is in a range of about 20 to 70 $\mu$m.

* * * * *